United States Patent
Ueda et al.

(10) Patent No.: US 10,756,116 B2
(45) Date of Patent: Aug. 25, 2020

(54) ACTIVE MATRIX SUBSTRATE HAVING THIN FILM TRANSISTORS THAT EACH INCLUDE COPPER GATE ELECTRODE AND OXIDE SEMICONDUCTOR LAYER

(71) Applicant: SHARP KABUSHIKI KAISHA, Sakai, Osaka (JP)

(72) Inventors: Teruyuki Ueda, Sakai (JP); Yoshihito Hara, Sakai (JP); Tohru Daitoh, Sakai (JP); Hajime Imai, Sakai (JP); Hideki Kitagawa, Sakai (JP); Masaki Maeda, Sakai (JP); Tatsuya Kawasaki, Sakai (JP); Yoshiharu Hirata, Sakai (JP); Tetsuo Kikuchi, Sakai (JP); Toshikatsu Itoh, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/358,336

(22) Filed: Mar. 19, 2019

(65) Prior Publication Data
US 2019/0296056 A1    Sep. 26, 2019

(30) Foreign Application Priority Data

Mar. 20, 2018 (JP) ................................. 2018-052824
Sep. 19, 2018 (JP) ................................. 2018-174678

(51) Int. Cl.
*H01L 27/12* (2006.01)
*H01L 29/51* (2006.01)
(Continued)

(52) U.S. Cl.
CPC ........ *H01L 27/1225* (2013.01); *H01L 27/124* (2013.01); *H01L 27/127* (2013.01);
(Continued)

(58) Field of Classification Search
CPC ............. H01L 27/1214; H01L 27/1218; H01L 27/1225; H01L 27/124; H01L 29/41733;
(Continued)

(56) References Cited

U.S. PATENT DOCUMENTS 7,923,734 B2 * 4/2011 Xue ...................... G02F 1/1368
257/72
2012/0138922 A1  6/2012 Yamazaki et al.
(Continued)

FOREIGN PATENT DOCUMENTS

JP  2012-027159 A  2/2012
JP  2012-134475 A  7/2012
(Continued)

*Primary Examiner* — Stephen W Smoot
(74) *Attorney, Agent, or Firm* — ScienBiziP, P.C.

(57) ABSTRACT

An active matrix substrate includes a gate metal layer including a plurality of gate bus lines, and a thin film transistor arranged in each pixel region, wherein: the thin film transistor includes a gate electrode, an oxide semiconductor layer arranged on the gate electrode with a gate insulating layer interposed therebetween, wherein the gate electrode is formed in the gate metal layer and is electrically connected to a corresponding one of the plurality of gate bus lines, the gate metal layer has a layered structure including a copper alloy layer and a copper layer arranged on the copper alloy layer, wherein the copper alloy layer is of a copper alloy including Cu and at least one additive metal element, wherein the additive metal element includes Al, and an Al content of the copper alloy is 2 at % or more and 8 at % or less.

20 Claims, 7 Drawing Sheets

(51) Int. Cl.
*H01L 29/49* (2006.01)
*H01L 29/786* (2006.01)

(52) U.S. Cl.
CPC ...... *H01L 27/1218* (2013.01); *H01L 29/4908* (2013.01); *H01L 29/4958* (2013.01); *H01L 29/518* (2013.01); *H01L 29/7869* (2013.01)

(58) Field of Classification Search
CPC ......... H01L 29/42364; H01L 27/42372; H01L 27/42384; H01L 29/4908; H01L 29/495; H01L 29/4958; H01L 29/511; H01L 29/518; H01L 29/786; H01L 29/7869; H01L 29/42372; H01L 29/42384
See application file for complete search history.

(56) References Cited

U.S. PATENT DOCUMENTS

| | | | |
|---|---|---|---|
| 2012/0193628 A1 | 8/2012 | Sasaki et al. | |
| 2012/0319112 A1* | 12/2012 | Cho | H01L 29/45 257/57 |
| 2013/0048904 A1 | 2/2013 | Adaniya et al. | |
| 2013/0122323 A1 | 5/2013 | Miki et al. | |
| 2013/0285044 A1* | 10/2013 | Yuan | H01L 29/4908 257/43 |
| 2013/0320334 A1 | 12/2013 | Yamazaki et al. | |
| 2014/0286076 A1 | 9/2014 | Aoki et al. | |
| 2015/0325592 A1* | 11/2015 | Jia | G02F 1/13394 257/72 |
| 2016/0013256 A1* | 1/2016 | Gai | G09G 3/32 257/40 |
| 2017/0200829 A1 | 7/2017 | Watakabe et al. | |
| 2019/0165291 A1* | 5/2019 | Chen | H01L 51/0012 |
| 2019/0319131 A1* | 10/2019 | Uraoka | H01L 29/78606 |

FOREIGN PATENT DOCUMENTS

| | | |
|---|---|---|
| JP | 2012-169612 A | 9/2012 |
| JP | 2014-007399 A | 1/2014 |
| JP | 2014-209727 A | 11/2014 |
| JP | 5685204 B2 | 3/2015 |
| JP | 2017-123427 A | 7/2017 |

* cited by examiner

ACTIVE MATRIX SUBSTRATE HAVING THIN FILM TRANSISTORS THAT EACH INCLUDE COPPER GATE ELECTRODE AND OXIDE SEMICONDUCTOR LAYER

BACKGROUND

1. Technical Field

The present invention relates to an active matrix substrate formed by using an oxide semiconductor.

2. Description of the Related Art

An active matrix substrate used in a liquid crystal display device, or the like, includes a switching element such as a thin film transistor (hereinafter "TFT") for each pixel. Conventionally, as such TFTs (hereinafter, "pixel TFTs"), TFTs using an amorphous silicon film as the active layer (hereinafter, "amorphous silicon TFTs") and TFTs using a polycrystalline silicon film as the active layer (hereinafter, "polycrystalline silicon TFTs") have been widely used.

On the other hand, techniques are known in the art for monolithically (integrally) providing peripheral circuits such as driving circuits on the substrate. By monolithically forming driving circuits, it is possible to reduce the width of the non-display region and to reduce the cost by simplifying the mounting step. In the present specification, TFTs used in a peripheral circuit monolithically formed on an active matrix substrate are referred to as "circuit TFTs".

An oxide semiconductor is used in some cases, instead of an amorphous silicon or a polycrystalline silicon, as the material of the active layer of a TFT. Such a TFT is referred to as an "oxide semiconductor TFT". An oxide semiconductor has a higher mobility than an amorphous silicon. Therefore, an oxide semiconductor TFT is capable of operating at a higher speed than an amorphous silicon TFT. Therefore, an oxide semiconductor TFT can suitably be used not only as a pixel TFT but also as a circuit TFT.

An active matrix substrate also includes a plurality of gate bus lines and a plurality of source bus lines, wherein the gate electrode of a pixel TFT is electrically connected to a corresponding one of the gate bus lines and the source electrode thereof to a corresponding one of the source bus lines. It is often the case that the gate electrode of the pixel TFT is formed from the same conductive film as the gate bus lines, and the source and drain electrodes thereof are formed from the same conductive film as the source bus lines. In the present specification, a layer that is formed from the same conductive film as the gate bus lines is referred to as a "gate metal layer", and a layer that is formed from the same conductive film as the source bus lines is referred to as a "source metal layer". A metal layer such as a copper (Cu) layer or an aluminum (Al) layer, for example, is used for the gate metal layer and the source metal layer.

In recent years, the resolution has been increasing particularly with large-sized display panels. For example, display panels have been developed having a resolution of "8K" (7680×4320 pixels), which is 4 times that of "4K" (3840×2160 pixels) (or 16 times that of "Full HD" (1920×1080 pixels)).

As the size and the resolution of a display panel increase, the number of pixels increases, and the write time Tg per pixel decreases. Therefore, there is a need to set the time constant of the gate bus lines small, and there is a demand for further reducing the resistance of the gate metal layer.

In order to reduce the sheet resistance of the gate metal layer, it is preferred that a Cu layer having a lower electric resistance than an Al layer is used for the gate metal layer. For example, Japanese Patent No. 5685204 (hereinafter, Patent Document No. 1) discloses using a Cu layer as the primary layer of the gate metal layer and providing a titanium (Ti) layer on the substrate side of the Cu layer in order to ensure adhesion between the Cu layer and the substrate surface (or the base surface). In the present specification, such a layered structure is referred to as the "Cu/Ti layered metal structure".

SUMMARY

However, a study by the present inventors revealed that there are cases where the sheet resistance of the gate metal layer cannot be reduced to a desired value even when using a Cu layer.

For example, when a gate metal layer having a Cu/Ti layered metal structure is used in an active matrix substrate, the following problem may occur.

With an active matrix substrate including bottom gate-type pixel TFTs, after the formation of the gate metal layer on the substrate, a TFT process such as the formation of a gate insulating layer, a semiconductor layer and a source metal layer is performed. In this TFT process, Ti included in the lower layer of the gate metal layer may possibly diffuse into the Cu layer due to a thermal influence from the film formation by a plasma CVD method, an annealing treatment on the oxide semiconductor layer, etc. As a result, the resistance of the Cu layer increases, resulting in a high sheet resistance of the gate metal layer.

Thus, it is conventionally difficult to keep the sheet resistance of the gate metal layer low.

An embodiment of the present invention has been made in view of the circumstances described above, and it is an object thereof to provide an active matrix substrate including a gate metal layer having a low resistance or an active matrix substrate including a gate metal layer having a low resistance and having a good adhesion.

The present specification discloses active matrix substrates as described in the following items.

[Item 1] An active matrix substrate having a plurality of pixel regions, the active matrix substrate including:

a substrate;

a source metal layer including a plurality of source bus lines and a gate metal layer including a plurality of gate bus lines, supported on the substrate; and a thin film transistor and a pixel electrode arranged in each of the plurality of pixel regions, wherein:

the thin film transistor includes a gate electrode, a gate insulating layer covering the gate electrode, an oxide semiconductor layer arranged on the gate insulating layer, and a source electrode and a drain electrode electrically connected to the oxide semiconductor layer, wherein the gate electrode is formed in the gate metal layer and is electrically connected to a corresponding one of the plurality of gate bus lines, the source electrode is electrically connected to a corresponding one of the plurality of source bus lines, and the drain electrode is electrically connected to the pixel electrode;

the gate metal layer has a layered structure including a copper alloy layer and a copper layer, wherein the copper alloy layer is a lowermost layer of the gate metal layer, and the copper layer is arranged on the copper alloy layer; and the copper alloy layer is of a copper alloy including Cu and at least one additive metal element, wherein the at least one additive metal element includes Al, and an Al content of the copper alloy is 2 at % or more and 8 at % or less.

[Item 2] The active matrix substrate according to item 1, wherein the at least one additive metal element further includes Mg.

[Item 3] The active matrix substrate according to item 1 or 2, wherein an Mg content of the copper alloy is 1 at % or more and 3 at % or less.

[Item 4] The active matrix substrate according to any one of items 1 to 3, wherein a Cu content of the copper alloy is 80 at % or more.

[Item 5] The active matrix substrate according to any one of items 1 to 4, wherein the at least one additive metal element does not include P.

[Item 6] The active matrix substrate according to any one of items 1 to 5, wherein the gate insulating layer includes an oxygen-containing silicon layer in direct contact with an upper surface of the copper layer, and the oxygen-containing silicon layer is a silicon oxide layer or a silicon oxynitride layer.

[Item 7] The active matrix substrate according to item 6, wherein the oxygen-containing silicon layer is a silicon oxynitride layer expressed as SiOxNy (2>x>0, 4/3>y>0), wherein x and y satisfy $0.4 \leq x/(x+y) < 1$.

[Item 8] The active matrix substrate according to item 7, wherein x and y satisfy $x \geq y$.

[Item 9] The active matrix substrate according to any one of items 6 to 8, wherein:

the gate insulating layer has a layered structure including the oxygen-containing silicon layer, another oxygen-containing silicon layer in direct contact with the oxide semiconductor layer, and a silicon nitride layer located between the oxygen-containing silicon layer and the other oxygen-containing silicon layer; and the other oxygen-containing silicon layer is a silicon oxide layer or a silicon oxynitride layer.

[Item 10] The active matrix substrate according to item 9, wherein:

the other oxygen-containing silicon layer is a silicon oxide layer; and the gate insulating layer further includes an intermediate layer of silicon oxynitride between the other oxygen-containing silicon layer and the silicon nitride layer.

[Item 11] The active matrix substrate according to any one of items 1 to 10, wherein a thickness of the copper alloy layer is less than a thickness of the copper layer.

[Item 12] The active matrix substrate according to any one of items 1 to 11, wherein a thickness of the copper alloy layer is 30 nm or more.

[Item 13] The active matrix substrate according to any one of items 1 to 12, wherein an overall thickness of the gate metal layer is 550 nm or less, and a sheet resistance of the gate metal layer is 0.05 Ω/square or less.

[Item 14] The active matrix substrate according to any one of items 1 to 13, wherein the substrate is a glass substrate, and the copper alloy layer is in direct contact with a surface of the glass substrate.

[Item 15] An active matrix substrate having a plurality of pixel regions, the active matrix substrate including:

a substrate;

a source metal layer including a plurality of source bus lines and a gate metal layer including a plurality of gate bus lines, supported on the substrate; and a thin film transistor and a pixel electrode arranged in each of the plurality of pixel regions, wherein:

the thin film transistor includes a gate electrode, a gate insulating layer covering the gate electrode, an oxide semiconductor layer arranged on the gate insulating layer, and a source electrode and a drain electrode electrically connected to the oxide semiconductor layer, wherein the gate electrode is formed in the gate metal layer and is electrically connected to a corresponding one of the plurality of gate bus lines, the source electrode is electrically connected to a corresponding one of the plurality of source bus lines, and the drain electrode is electrically connected to the pixel electrode;

the gate metal layer includes a copper layer in direct contact with the gate insulating layer;

the gate insulating layer has a layered structure including a first oxygen-containing silicon layer in direct contact with the oxide semiconductor layer, a second oxygen-containing silicon layer in direct contact with an upper surface of the copper layer, and a silicon nitride layer located between the first oxygen-containing silicon layer and the second oxygen-containing silicon layer; and the first oxygen-containing silicon layer and the second oxygen-containing silicon layer are each a silicon oxide layer or a silicon oxynitride layer.

[Item 16] The active matrix substrate according to item 15, wherein the second oxygen-containing silicon layer is a silicon oxynitride layer expressed as SiOxNy (2>x>0, 4/3>y>0), wherein x and y satisfy $0.4 \leq x/(x+y) < 1$.

[Item 17] The active matrix substrate according to item 16, wherein x and y satisfy $x \geq y$.

[Item 18] The active matrix substrate according to any one of items 15 to 17, wherein the first oxygen-containing silicon layer is a silicon oxide layer.

[Item 19] The active matrix substrate according to item 18, further including an intermediate layer of silicon oxynitride between the first oxygen-containing silicon layer and the silicon nitride layer.

[Item 20] The active matrix substrate according to any one of items 1 to 19, wherein the oxide semiconductor layer includes In, Ga and Zn.

[Item 21] The active matrix substrate according to item 20, wherein the oxide semiconductor layer includes an In—Ga—Zn—O-based semiconductor.

[Item 22] The active matrix substrate according to item 21, wherein the oxide semiconductor layer includes a crystalline portion.

According to one embodiment of the present invention, it is possible to provide an active matrix substrate including a gate metal layer having a low resistance or an active matrix substrate including a gate metal layer having a low resistance and having a good adhesion.

DETAILED DESCRIPTION

First Embodiment

The present inventors made an in-depth study on realizing a wiring structure with which it is possible to achieve both a low sheet resistance and a high adhesion. As a result, the present inventors found that it is possible to improve the adhesion to the substrate surface while maintaining a low sheet resistance by providing a Cu alloy layer having a predetermined composition on the substrate side of the Cu layer. In the present specification, such a structure is referred to as a "Cu/Cu alloy layered metal structure".

An active matrix substrate according to one embodiment of the present invention will now be described with reference to the drawings.

Figure 1:
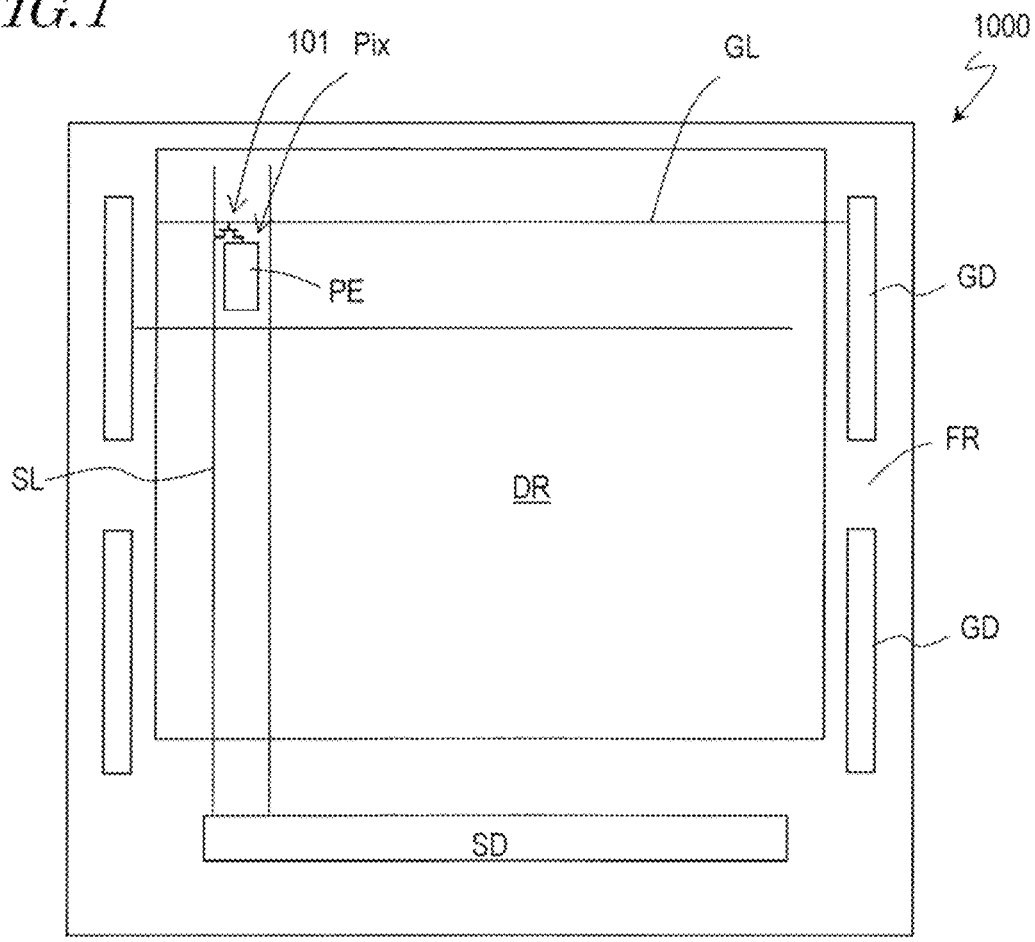
FIG. 1 is a schematic view showing an example of a planar structure of an active matrix substrate 1000 of the first embodiment.

FIG. 1 is a schematic view showing an example of the planar structure of an active matrix substrate 1000 of the present embodiment.

The active matrix substrate 1000 has a display region DR, and a region (the non-display region or bezel region) FR other than the display region DR. The display region DR includes pixel regions Pix arranged in a matrix pattern. The pixel region Pix is a region corresponding to a pixel of the display device, and may be referred to simply as a "pixel". Each pixel region Pix includes a TFT 101, which is a pixel TFT, and a pixel electrode PE. Although not shown in the figures, when the active matrix substrate 1000 is used as a display device of a transverse electric field mode such as an FFS (Fringe Field Switching) mode, a common electrode is provided on the active matrix substrate 1000 so as to oppose the pixel electrode PE with an insulating layer (dielectric layer) interposed therebetween.

The non-display region FR is a region that is located around the display region DR and does not contribute to display. The non-display region FR includes a terminal portion formation region where terminal portions are formed, a driving circuit formation region where driving circuit are provided integrally (monolithically), etc. In the driving circuit formation region, a gate driver GD, a test circuit (not shown), etc., are provided monolithically, for example. A source driver SD is mounted on the active matrix substrate 1000, for example.

A plurality of gate bus lines GL extending in the first direction (herein, the row direction) and a plurality of source bus lines SL extending in the second direction (herein, the column direction) perpendicular to the first direction are formed in the display region DR. The pixels are defined by the gate bus lines GL and the source bus lines SL, for example. Each gate bus line GL is connected to a terminal of the gate driver GD. Each source bus line SL is connected to a terminal of the source driver SD mounted on the active matrix substrate 1000.

<Configuration of Pixel Region Pix>

Next, the configuration of each pixel region Pix of the active matrix substrate 1000 will be described. Herein, an active matrix substrate used in an LCD panel of an FFS mode will be described, as an example.

Figure 2A:
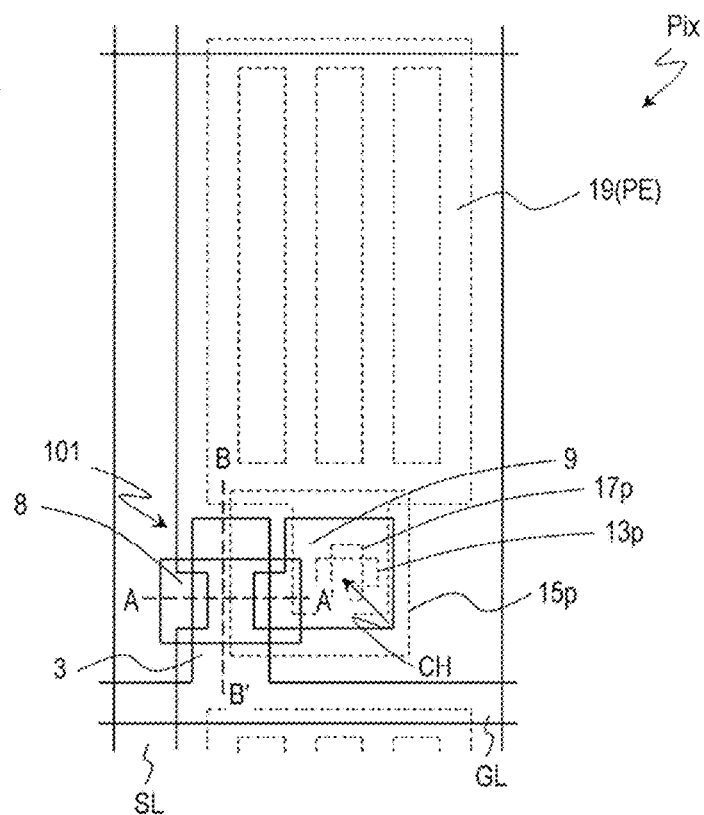
FIG. 2A is a schematic plan view showing a TFT 101 of an active matrix substrate of the first embodiment.
Figure 2B:
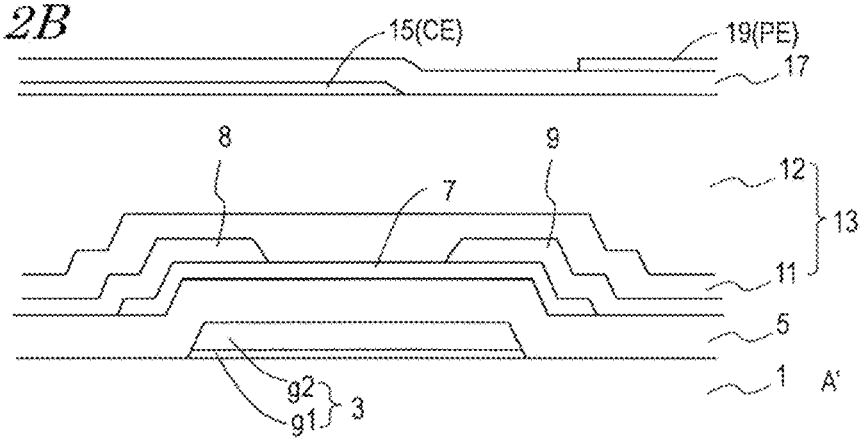
FIGS. 2B and 2C are schematic cross-sectional views showing the TFT 101 taken along line A-A' and line B-B', respectively.
Figure 2C:
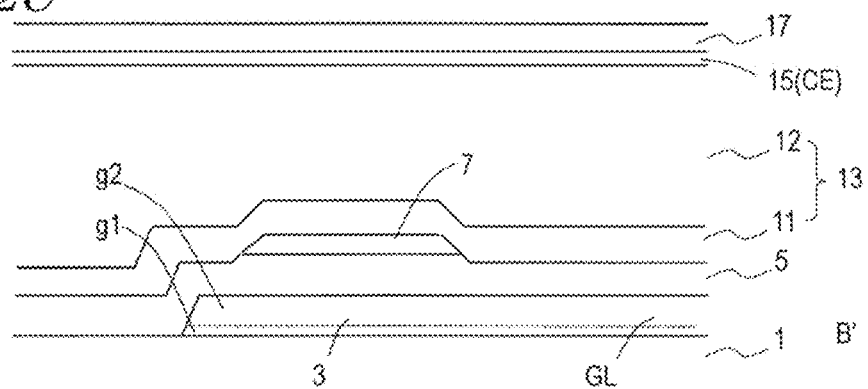

FIG. 2A is a plan view showing one pixel region Pix of the active matrix substrate 1000, and FIGS. 2B and 2C are cross-sectional views taken along line A-A' and line B-B' of FIG. 2A.

The pixel region Pix is a region that is surrounded by source bus lines SL and gate bus lines GL. The pixel region Pix includes a substrate 1, the TFT 101 supported on the substrate 1, a lower transparent electrode 15, and an upper transparent electrode 19. In this example, the lower transparent electrode 15 is the common electrode CE, and the upper transparent electrode 19 is the pixel electrode PE. Note that the lower transparent electrode 15 may be the pixel electrode PE, and the upper transparent electrode 19 may be the common electrode CE.

The TFT 101 is a bottom gate structure TFT of a channel-etched type, for example. The TFT 101 includes a gate electrode 3, a gate insulating layer 5 covering the gate electrode 3, an oxide semiconductor layer 7 arranged on the gate insulating layer 5, and a source electrode 6 and a drain electrode 9 electrically connected to the oxide semiconductor layer 7.

The gate electrode 3 is formed in the gate metal layer including the gate bus lines GL. That is, the gate electrode 3 is formed by using the same conductive film as the gate bus lines GL. The gate electrode 3 is electrically connected to a corresponding one of the gate bus lines GL. As shown in the figure, the gate electrode 3 and the corresponding gate bus line GL may be formed integral together.

In the present embodiment, the gate metal layer has a layered structure (Cu/Cu alloy layered metal structure) including a copper alloy layer g1 and a copper layer g2 in this order from the substrate 1 side.

The copper alloy layer g1 is the lowermost layer of the gate metal layer, and is in direct contact with the surface of the substrate 1, for example. Although not shown in the figure, when a base insulating film is provided between the substrate 1 and the gate metal layer, the copper alloy layer g1 is in direct contact with the base insulating film. The copper layer g2 is arranged on the copper alloy layer g1. The copper layer g2 may be in contact with the upper surface of the copper alloy layer g1.

The copper alloy layer g1 is a layer of a Cu alloy including Cu and at least one additive metal element. The additive metal element of the Cu alloy includes Al, and the Al content of the Cu alloy is 2 at % or more and 8 at % or less. By including 2 at % or more of Al, it is possible to improve the adhesion to the substrate surface. Since the corrosion resistance of the gate metal layer can be improved, it is possible to improve the reliability. On the other hand, if the Al content is 8 at % or less, it is possible to suppress the increase in the resistance of the copper layer g2 due to oxidization of the copper layer g2 by Al.

The Cu alloy may be a Cu—Al alloy (binary). Alternatively, the Cu alloy may include, in addition to Al, other metal elements such as Mg, Ca, Mo and Mn, as additive metal elements. There is no particular limitation on the type, content, etc., of the other metal element. Note however that the Cu alloy preferably does not include phosphorus (P), sodium (Na), boron (B), or the like, in view of the impurity to the semiconductor.

As an example, the Cu alloy may include Al and Mg as additive metal elements. By adding Mg in addition to Al, it is possible to further increase the reliability, such as corrosion resistance, and it is possible to improve the stability of the Cu alloy. In such a case, the Mg content may be 1 at % or more and 3 at % or less, for example. The Mg content may be less than or equal to the Al content. The Cu alloy may be a Cu—Al—Mg alloy (ternary), or may further include other metal elements.

Note that the "Cu alloy" as used in the present specification refers to an alloy whose primary metal element is Cu. The Cu content of the Cu alloy is 80 at % or more and 98 at % or less, for example.

The copper layer g2 is a layer whose primary component is Cu. The Cu content of the copper layer g2 is 90% or more, for example. Preferably, the copper layer g2 may be a pure Cu layer (Cu content: 99.99% or more, for example).

The copper alloy layer g1 and the copper layer g2 may include an unavoidable impurity.

The oxide semiconductor layer 7 is arranged so that at least a part thereof overlaps with the gate electrode 3 with the gate insulating layer 5 interposed therebetween. The oxide semiconductor layer 7 is an In—Ga—Zn—O-based semiconductor layer, for example.

The source electrode 8 and the drain electrode 9 are each arranged so as to be in contact with a portion of the upper surface of the oxide semiconductor layer 7. The portion of the oxide semiconductor layer 7 that is in contact with the source electrode 8 is referred to as the source contact region, and the portion thereof that is in contact with the drain electrode 9 is referred to as the drain contact region. As seen from the direction normal to the substrate 1, a region that is located between the source contact region and the drain contact region and overlaps with the gate electrode 3 is a "channel region". The source electrode 8 is electrically connected to a corresponding one of the source bus lines SL. The drain electrode 9 is electrically connected to the pixel electrode PE.

The source electrode 8 and the drain electrode 9 may be formed in the source metal layer including the source bus lines SL. That is, the source electrode 8 and the drain electrode 9 may be formed by using the same conductive film as the source bus line SL. The source electrode 8 may be formed integral with the corresponding source bus line SL.

The TFT 101, the gate metal layer and the source metal layer are covered by an interlayer insulating layer 13. Although there is no particular limitation, an interlayer insulating layer 13 may include an inorganic insulating layer (passivation film) 11, and an organic insulating layer 12 arranged on the inorganic insulating layer 11, for example. The inorganic insulating layer 11 may be in contact with the channel region of the TFT 101. Note that the interlayer insulating layer 13 does not need to include an organic insulating layer.

The lower transparent electrode 15 to be the common electrode CE, the dielectric layer 17, and the upper transparent electrode 19 to be the pixel electrode PE are provided on the interlayer insulating layer 13. The pixel electrode PE and the common electrode CE are arranged on the interlayer insulating layer 13 so as to partially overlap with each other with the dielectric layer 17 interposed therebetween. The pixel electrode PE is divided into portions corresponding to pixels. The common electrode CE does not need to be divided into portions corresponding to pixels. Herein, the common electrode CE is formed on the interlayer insulating layer 13. The pixel electrode PE is formed on the dielectric layer 17, and electrically connected to the drain electrode 9 through a contact hole CH provided in the interlayer insulating layer 13 and the dielectric layer 17. In this example, a portion where an opening 13p of the interlayer insulating layer 13 and an opening 17p of the dielectric layer 17 overlap with each other serves as the contact hole CH. Although not shown in the figures, the pixel electrode PE has at least one slit or a cut-out for each pixel. The common electrode CE has an opening 15p in a region where the contact hole CH is formed. The common electrode CE may extend entirely over the pixel region Pix excluding this region.

The active matrix substrate 1000 can be applicable to a display device of an FFS mode, for example. The FFS mode is a transverse electric field mode in which a pair of electrodes (the pixel electrode PE and the common electrode CE) are provided on one substrate, and an electric field is applied through the liquid crystal molecules in the direction (transverse direction) parallel to the substrate surface.

The active matrix substrate of the present embodiment can be used in a display device of a vertical electric field driving mode, such as the VA mode. In such a case, the common electrode CE is formed on the counter substrate, which is arranged so as to oppose the active matrix substrate with the liquid crystal layer interposed therebetween.

Advantageous Effects of Present Embodiment

With the active matrix substrate 1000 of the present embodiment, since the copper alloy layer g1 is provided on the substrate side of the copper layer g2 of the gate metal layer, it is possible to improve the adhesion to the surface of the substrate 1.

As described above, with a conventional gate metal layer having a Cu/Ti layered metal structure, Ti may possibly diffuse into the Cu layer due to a thermal influence from the TFT process, thereby increasing the sheet resistance. In contrast, in the present embodiment, it is possible to maintain the low sheet resistance of the gate metal layer even after the TFT process is performed. This is because the content of a metal element (e.g., Al) other than Cu of the lower layer of the gate metal layer is suppressed (the total content of additive metal elements is 5% when Cu content is 95%, for example), and therefore even if the metal element diffuses into the copper layer g2, it is possible to suppress the increase in the resistance of the copper layer g2 due to the diffusion. Therefore, it is possible to realize a gate metal layer that has a low sheet resistance and that has a good adhesion.

The Cu content of the copper alloy layer g1 may be 80 at % or more, for example. Then, since the total content of the additive metal element such as Al is suppressed to be 20 at % or less, it is possible to more effectively suppress the increase in the resistance of the copper layer g2 due to the diffusion of the additive metal element.

The thickness of the copper alloy layer g1 is preferably 30 nm or more, for example. Then, it is possible to further increase the adhesion to the surface of the substrate 1 (or the base surface). On the other hand, the thickness of the copper alloy layer g1 may be 100 nm or less, for example. Then, it is possible to suppress the increase in the thickness of the gate metal layer as a whole. The thickness of the copper alloy layer g1 may be smaller than the thickness of the copper layer g2. By increasing the thickness of the copper layer g2 having a low electric resistance, it is possible to more effectively lower the sheet resistance of the gate metal layer.

The present embodiment also provides the following advantage. When forming a conventional gate metal layer having a Cu/Ti layered metal structure, the gate metal layer is patterned by using a hydrogen peroxide-based etchant that contains ammonium fluoride and/or acidic ammonium fluoride, for example. Then, the Cu layer and the Ti layer are both etched. However, when the gate metal layer is formed directly on the glass substrate surface, a surface portion of the glass substrate, which is the base, may also be etched along the gate pattern, thereby lowering the strength of the glass substrate. In contrast, in the present embodiment, the gate metal layer can be patterned by using a hydrogen peroxide-based etchant that does not contain ammonium fluoride or acidic ammonium fluoride. This etchant etches both the copper layer g2 and the copper alloy layer g1, but it does not substantially etch the glass substrate. Therefore, it is possible to suppress the overetch of the glass substrate, and it is therefore possible to ensure strength of the glass substrate.

Using a hydrogen peroxide-based etchant that does not contain ammonium fluoride or acidic ammonium fluoride also provides an advantage that it is possible to reduce the shift amount of the side surface of the gate metal layer, as compared with a case where a hydrogen peroxide-based etchant that contains ammonium fluoride and/or acidic ammonium fluoride is used.

Moreover, with a display panel using an active matrix substrate of the present embodiment, it is possible to reuse light from the backlight that has been reflected at the lower surface of the Cu alloy layer, and it is therefore possible to improve the transmittance for visible light as compared with a conventional display panel including a gate metal layer of a Cu/Ti layered metal structure.

<Structure of Gate Insulating Layer>

An example of a structure of the gate insulating layer 5 of the present embodiment will now be described.

A silicon oxide (SiOx, $0<x\leq2$) layer, a silicon nitride (SiNz, $0<z<4/3$) layer, a silicon oxynitride (SiOxNy, $2>x>0$, $4/3>y>0$) layer, etc., may be used for the gate insulating layer 5. The gate insulating layer 5 may have a layered structure. The term "silicon oxynitride" as used herein includes silicon oxide nitride where the oxygen proportion x is greater than the nitrogen proportion y ($x>y$), and silicon nitride oxide where the nitrogen proportion y is greater than the oxygen proportion x ($y>x$). In the present specification, silicon layers (insulating layers) that contain oxygen such as silicon oxide and silicon oxynitride will be referred to collectively as "oxygen-containing silicon layers".

Figure 7:
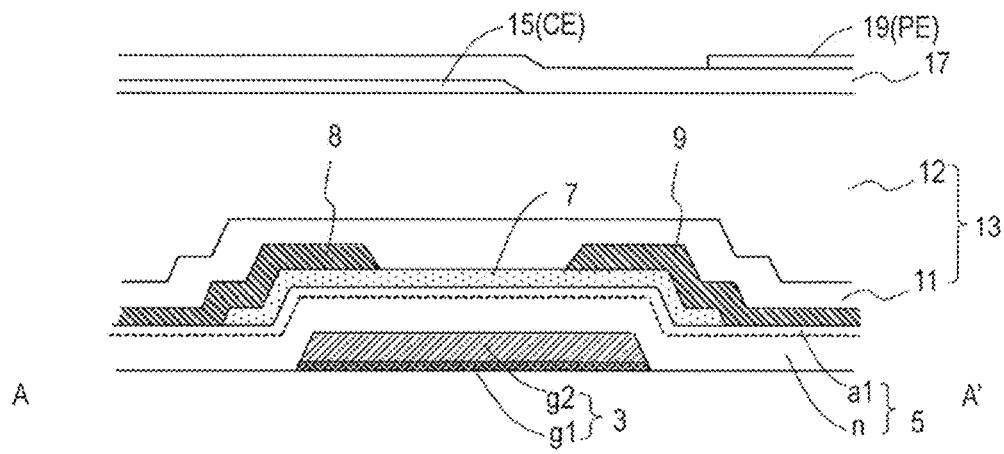
FIG. 7 is a cross-sectional view illustrating a structure of a gate insulating layer.

FIG. 7 illustrates a structure of the gate insulating layer of the TFT 101, showing a cross-sectional structure taken along line A-A' of FIG. 2A.

As illustrated in FIG. 7, the gate insulating layer 5 may have a layered structure including a silicon nitride layer n, and an oxygen-containing silicon layer (hereinafter, first oxygen-containing silicon layer) a1 arranged on the silicon nitride layer n. The first oxygen-containing silicon layer a1 is the uppermost layer of the gate insulating layer 5, and is in direct contact with the oxide semiconductor layer 7. The first oxygen-containing silicon layer a1 is preferably a silicon oxide layer. The first oxygen-containing silicon layer a1 may be a silicon oxide nitride (SiOxNy, $x>y$) layer. A silicon nitride oxide (SiOxNy, $y>x$) layer may be used instead of the silicon nitride layer n. Note however that it is preferred to use the silicon nitride layer n, which has a good moisture impermeability.

Where the first oxygen-containing silicon layer (e.g., an oxide layer such as $SiO_2$) a1 is used as the uppermost layer (that is, a layer that is in contact with the oxide semiconductor layer) of the gate insulating layer 5, when the oxide semiconductor layer 7 has oxygen deficiency, it is possible to recover from oxygen deficiency using oxygen contained in the oxide layer, thus reducing oxygen deficiency in the oxide semiconductor layer 7. By providing the silicon nitride layer n having a good barrier property on the substrate 1 side of the first oxygen-containing silicon layer a1, it is possible to effectively prevent an impurity from the substrate 1 from being diffused into the oxide semiconductor layer 7.

<Variation>

The gate insulating layer 5 includes an oxygen-containing silicon layer in contact with the upper surface of the copper layer g2. The oxygen-containing silicon layer is a film that has a higher stability than the silicon nitride layer, and the amount of impurity included in the oxygen-containing silicon layer is smaller than the silicon nitride layer. Therefore, when the oxygen-containing silicon layer (hereinafter, the second oxygen-containing silicon layer) is arranged as the lowermost layer of the gate insulating layer 5, diffusion of an impurity from the gate insulating layer 5 into the copper layer g2 is suppressed. Therefore, it is possible to more effectively reduce the sheet resistance of the gate metal layer (the copper layer g2), and to suppress variations in the sheet resistance.

Figure 8A:
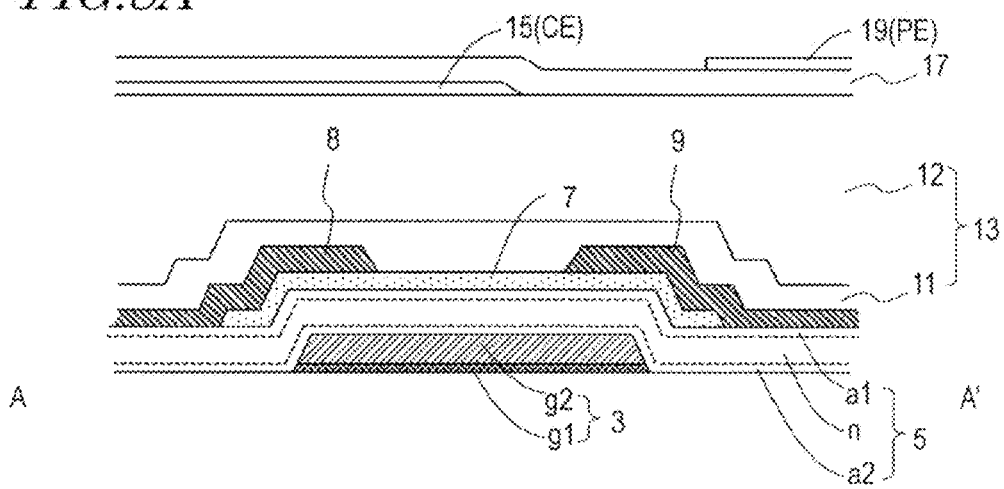
FIGS. 8A and 8B are cross-sectional views each illustrating another gate insulating layer.
Figure 8B:
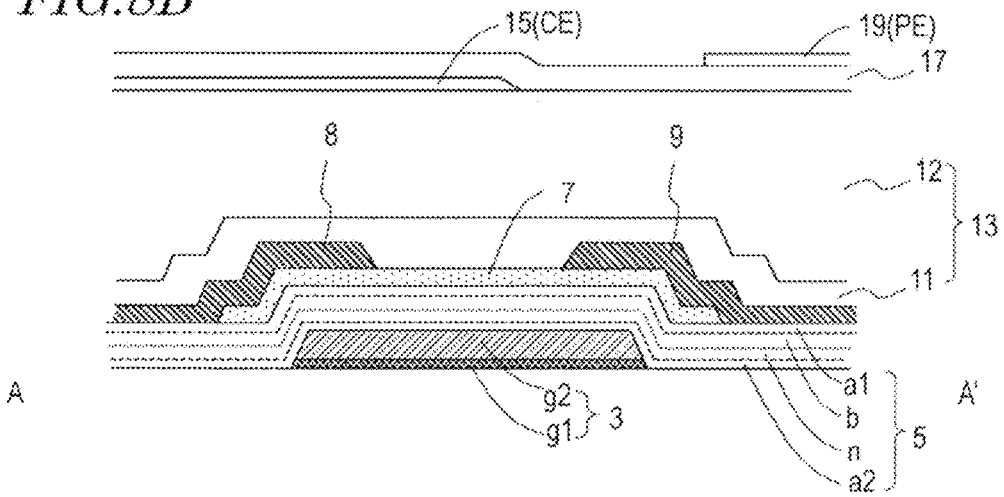

FIGS. 8A and 8B are cross-sectional views illustrating gate insulating layers 5 of the active matrix substrates of Variations 1 and 2. The following description will focus on differences from the gate insulating layer 5 shown in FIG. 7 while omitting redundant description as appropriate.

As shown in FIG. 8A, the gate insulating layer 5 of Variation 1 is different from the gate insulating layer 5 shown in FIG. 7 in that it further includes the second oxygen-containing silicon layer a2 on the substrate 1 side of the silicon nitride layer n. That is, the gate insulating layer 5 of Variation 1 has a layered structure including the first oxygen-containing silicon layer a1 in direct contact with the oxide semiconductor layer 7, the second oxygen-containing silicon layer a2 in direct contact with the upper surface of the copper layer g2, and the silicon nitride layer n located between the first oxygen-containing silicon layer a1 and the second oxygen-containing silicon layer a2.

The second oxygen-containing silicon layer a2 is a silicon oxide layer (SiOx, $2>x>0$) or a silicon oxynitride layer (SiOxNy, $2>x>0$, $4/3>y>0$). Among these, it is preferred to use a silicon oxynitride layer in order to ensure adhesion to the surface of the copper layer g2. The oxygen proportion x and the nitrogen proportion y of the second oxygen-containing silicon layer a2 may be set so as to satisfy $0.4 \leq x/(x+y)<1$. By increasing the oxygen content so that $x/(x+y)$ is 0.4 or more, it is possible to ensure the stability of the second oxygen-containing silicon layer a2, and to more effectively suppress diffusion of an impurity into the copper layer g2. Preferably, the oxygen proportion x is greater than or equal to the nitrogen proportion y ($x \geq y$), and more preferably, the oxygen proportion x is greater than the nitrogen proportion y ($x>y$, i.e., $x/(x+y)>0.5$). On the other hand, when $x/(x+y)$ is 0.8 or less ($x/(x+y) \leq 0.8$), it is possible to more reliably increase the adhesion to the surface of the copper layer g2.

Note that the second oxygen-containing silicon layer a2 may be a gradient layer in which the oxygen proportion x and the nitrogen proportion y change in the thickness direction. In such a case, it is only required that the composition (x, y) of the lower surface of the second oxygen-containing silicon layer a2 (the surface in contact with the gate metal layer) satisfy the relationship described above.

As shown in FIG. 8B, the gate insulating layer 5 of Variation 2 is different from the gate insulating layer 5 of Variation 1 in that it further includes an intermediate layer b of silicon oxynitride between the first oxygen-containing silicon layer a1 and the silicon nitride layer n.

The interface reflection can be reduced by providing the intermediate layer b between the first oxygen-containing silicon layer a1 (refractive index: 1.4 to 1.5, for example) and the silicon nitride layer n (refractive index: 1.9 to 2.0, for example), wherein the intermediate layer b has an intermediate refractive index therebetween. As a result, it is possible to more effectively suppress interference color.

There is no particular limitation on the composition of the intermediate layer b. For example, the oxygen proportion x and the nitrogen proportion y in the intermediate layer b may be set to satisfy $0.3 \leq x/(x+y) \leq 0.7$. For example, x:y may be set to be about 1:1. Note that the intermediate layer b may be a gradient layer wherein the oxygen proportion x and the nitrogen proportion y change in the thickness direction.

In Variations 1 and 2, there is no particular limitation on the thicknesses of the layers of the gate insulating layer 5.

It is preferred that the silicon nitride layer n is thicker than the first oxygen-containing silicon layer a1, the second oxygen-containing silicon layer a2 and the intermediate layer b. Then, it is possible to further increase the barrier property of the gate insulating layer 5. The thickness of the silicon nitride layer n is 100 nm or more and 500 nm or less, for example.

The thickness of the first oxygen-containing silicon layer a1 may be, for example, 15 nm or more and less than the thickness of the silicon nitride layer n. If 15 nm or more, it is possible to more reliably reduce the oxygen deficiency of the oxide semiconductor layer 7.

The thickness of the second oxygen-containing silicon layer a2 may be, for example, 20 nm or more and less than the thickness of the silicon nitride layer n. If 20 nm or more, it is possible to more reliably suppress diffusion of an impurity into the copper layer g2.

Although there is no particular limitation, the thickness of the intermediate layer b may be, for example, 100 nm or more and less than the thickness of the silicon nitride layer n. If 100 nm or more, it is possible to realize a moisture permeation preventing effect.

The layered structure of the gate insulating layer 5 of the present embodiment is not limited to the structure illustrated in FIG. 7 to FIG. 9B. The gate insulating layer 5 may have a layered structure of five layers or more. For example, it may include a plurality of intermediate layers b. Alternatively, it may include another intermediate layer between the second oxygen-containing silicon layer a2 and the silicon nitride layer n.

<Method for Manufacturing TFT 101>

An example of a method for manufacturing the TFT 101 will now be described with reference to FIGS. 2A to 2C.

First, a gate metal layer including the gate electrode 3 and the gate bus line GL is formed on the substrate 1.

The substrate 1 may be a glass substrate, a silicon substrate, a plastic substrate (resin substrate) having a heat resistance, etc., for example.

The gate metal layer is formed as follows. First, a Cu alloy film and a Cu film are formed in this order on the substrate (e.g., a glass substrate) 1 by a sputtering method, thereby obtaining a layered metal film. Next, the layered metal film is wet-etched. A hydrogen peroxide-based etchant (not including ammonium fluoride or acidic ammonium fluoride) is used for wet etching. Then, the gate metal layer is obtained that has a layered metal structure including the copper alloy layer g1 as the lower layer and the copper layer g2 as the upper layer. The gate metal layer includes the gate electrode 3, the gate bus line GL, etc.

Note that it is only required that the gate metal layer include the copper alloy layer g1 and the copper layer g2, and it may have a layered structure of three layers or more. For example, it may include a further Cu alloy layer on the copper layer g2. Note however that it is preferred that the gate metal layer does not include a Ti layer, a W layer or an alloy thereof in order to pattern the gate metal layer by wet etching using a hydrogen peroxide-based etchant.

Next, the gate insulating layer 5 is formed so as to cover the gate metal layer. The gate insulating layer 5 can be formed by a CVD method, or the like.

A silicon oxide ($SiO_2$) layer, a silicon nitride (SiNz) layer, a silicon oxide nitride (SiOxNy; x>y) layer, a silicon nitride oxide (SiNzOy; x>y) layer, or the like, may suitably be used as the gate insulating layer 5. These layers can be formed by a know method (e.g., a CVD method, a plasma CVD method, etc.).

A silicon nitride layer, a silicon nitride oxide layer, or the like, may be formed as the gate insulating layer 5 on the substrate side (the lower layer), for example, as described above with reference to FIG. 7, in order to prevent diffusion of an impurity, etc., from the substrate 1, and a silicon oxide layer, a silicon oxide nitride layer, or the like, may be formed on a layer thereon (the upper layer) in order to ensure insulation. Herein, a layered film including an SiNz film having a thickness of 300 nm and an $SiO_2$ film having a thickness of 50 nm in this order from the substrate 1 side may be formed (see FIG. 7).

Alternatively, a layered film including an SiOxNy (e.g., x≥y) layer having a thickness of 100 nm as the second oxygen-containing silicon layer a2, an SiNz layer having a thickness of 300 nm as the silicon nitride layer n, and an $SiO_2$ layer having a thickness of 50 nm as the first oxygen-containing silicon layer a1 in this order may be formed as the gate insulating layer 5, as described above with reference to FIG. 8A. When a plasma CVD method is used, the composition of the SiOxNy layer can be controlled by adjusting the flow rate ratio between the material gas ($SiH_4$) and the reaction gas ($NH_3$, $N_2$ and $N_2O$). For example, the SiOxNy layer may be formed with a flow rate ratio such that x:y is about 1:1. Note that the flow rate ratio may be changed stepwise or continuously so that x:y changes in the thickness direction of the SiOxNy layer.

Alternatively, a layered film including an SiOxNy (e.g., x≥y) layer having a thickness of 100 nm as the second oxygen-containing silicon layer a2, an SiNz layer having a thickness of 300 nm as the silicon nitride layer n, an SiOxNy (e.g., x:y=about 1:1) layer having a thickness of 100 nm as the intermediate layer b, and an $SiO_2$ layer having a thickness of 50 nm as the first oxygen-containing silicon layer a1 in this order may be formed as the gate insulating layer 5, as described above with reference to FIG. 8B. When a plasma CVD method is used, the composition of the SiOxNy layer to be the second oxygen-containing silicon layer a2 and the intermediate layer b can be controlled by adjusting the flow rate ratio between the material gas and the reaction gas. The compositions (x:y) of the second oxygen-containing silicon layer a2 and the intermediate layer b may be equal to each other or may be different from each other. The SiOxNy layer may be formed with a flow rate ratio such that x:y is about 1:1, for example, as the second oxygen-containing silicon layer a2 and the intermediate layer b.

Then, an oxide semiconductor film (e.g., an In—Ga—Zn—O-based semiconductor film) is formed on the gate insulating layer 5 by using a sputtering method, for example. The thickness of the oxide semiconductor film may be 30 nm or more and 200 nm or less, for example. Thereafter, an annealing treatment of the oxide semiconductor film may be performed. Herein, a heat treatment is performed in the atmosphere at a temperature of 300° C. or more and 500° C. or less. The heat treatment time is 30 minutes or more and 2 hours or less, for example. Next, the oxide semiconductor film is patterned, thereby obtaining the oxide semiconductor layer 7.

Next, a source metal layer including the source electrode 8, the drain electrode 9 and the source bus line SL is formed.

The source metal layer may have a single-layer structure or may have a layered structure. Herein, a Ti film (thickness: 30 nm) and a Cu film (thickness: 300 nm) are formed in this order from the side of the oxide semiconductor layer 7, and the obtained layered film is patterned, thereby obtaining the source metal layer. The Cu film of the upper layer may be patterned by wet etching using a hydrogen peroxide-based etchant, and then the Ti film of the lower layer may be patterned by dry etching.

Note that a metal such as aluminum (Al), aluminum (Al), tungsten (W), molybdenum (Mo), tantalum (Ta), chromium (Cr), titanium (Ti), copper (Cu), etc., or an alloy thereof, or a metal nitride thereof, may suitably be used as the material of the source metal layer. Then, an oxidation treatment, e.g., a plasma treatment using an $N_2O$ gas, may be performed on the channel region of the oxide semiconductor layer 7. Thus, the TFT 101 is obtained.

Next, the inorganic insulating layer 11 is formed so as to be in contact with the channel region of the TFT 101. The inorganic insulating layer 11 may be a silicon oxide ($SiO_2$) film, a silicon nitride (SiNz) film, a silicon oxide nitride (SiOxNy; x>y) film, a silicon nitride oxide (SiNxOy; x>y) film, or the like, for example. Herein, an $SiO_2$ layer having a thickness of 300 nm, for example, is formed by a CVD method as the inorganic insulating layer. The temperature at which the inorganic insulating layer is formed may be 200° C. or more and 450° C. or less, for example. Although not shown in the figures, an organic insulating layer may be formed on the inorganic insulating layer 11. A positive-type photosensitive resin film having a thickness of 2000 nm, for example, may be formed as the organic insulating layer.

The lower transparent electrode 15 to be the common electrode CE, the dielectric layer 17, and the upper transparent electrode 19 to be the pixel electrode PE are provided on the interlayer insulating layer 13. The pixel electrode PE and the common electrode CE may each be formed from an ITO (indium-tin oxide) film, an In—Zn—O-based semiconductor (indium-zinc oxide) film, a ZnO film (zinc oxide film), or the like, for example. The thicknesses of the pixel electrode PE and the common electrode CE may each be 50 nm or more and 200 nm or less, for example. The dielectric layer 17 may be a silicon nitride (SiNz) film, a silicon oxide (SiOx) film, a silicon oxide nitride (SiOxNy; x>y) film, a silicon nitride oxide (SiNxOy; x>y) film, or the like, for example. The thickness of the dielectric layer 17 may be 70 nm or more and 300 nm or less, for example.

Second Embodiment

Figure 9A:
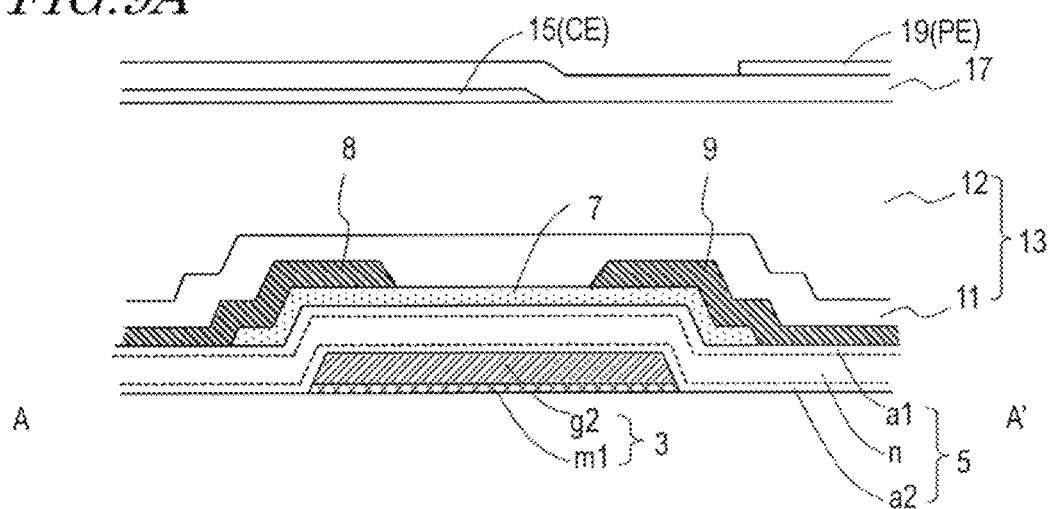
FIGS. 9A and 9B are cross-sectional views each illustrating an active matrix substrate of the second embodiment.
Figure 9B:
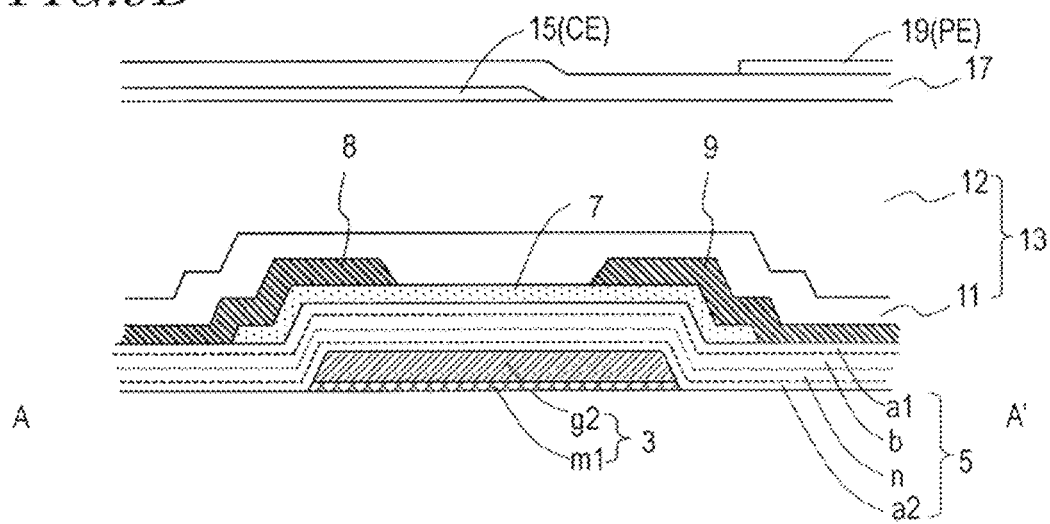

FIGS. 9A and 9B are cross-sectional views each illustrating an active matrix substrate of the second embodiment.

With the active matrix substrate of the present embodiment, the gate insulating layer 5 includes the first oxygen-containing silicon layer a1 in direct contact with the oxide semiconductor layer 7, the second oxygen-containing silicon layer a2 in direct contact with the upper surface of the copper layer g2, and the silicon nitride layer n located between the first oxygen-containing silicon layer a1 and the second oxygen-containing silicon layer a2. The gate insulating layer 5 may further include a silicon oxynitride layer (intermediate layer) b between the silicon nitride layer n and the first oxygen-containing silicon layer a1, as illustrated in FIG. 9B. The specific materials and thicknesses of the layers are similar to those described above with reference to FIGS. 8A and 8B, and will not be further described below.

In the present embodiment, it is only required that the gate metal layer include a Cu layer. It may have a layered structure including the copper layer g2 as the upper layer and a metal layer that can have a high adhesion (e.g., a copper alloy layer, a Ti layer or an Mo layer) m1 as the lowermost layer, as shown in the figures. The metal layer m1 to be the lowermost layer of the gate metal layer may be a copper alloy layer that includes Cu and at least one additive metal element. There is no particular limitation on the type and the amount of addition of the additive metal element. That is, a copper alloy layer having a different composition from the copper alloy layer g1 of the embodiment described above may be used as the metal layer m1. The metal layer m1 to be the lowermost layer of the gate metal layer may be a Ti layer or an Mo layer. Note that the gate metal layer may be a single layer of a Cu layer.

According to the present embodiment, it is possible to reduce diffusion of an impurity from the gate insulating layer 5 into the copper layer g2 by providing the second oxygen-containing silicon layer a2 as the lowermost layer of the gate insulating layer 5, and it is therefore possible to suppress an increase in the sheet resistance of the gate metal layer and variations in the sheet resistance of the gate metal layer due to diffusion of an impurity, irrespective of the material of the metal layer m1.

Embodiment Example and Reference Example

<Evaluation of Gate Metal Layer and Sheet Resistance>

Active matrix substrates of Embodiment Examples 1 and 2 and Reference Example were produced and compared against each other in terms of the sheet resistance of the gate metal layer.

Method for Manufacturing Active Matrix Substrate of Embodiment Example 1

First, a gate metal layer having a Cu/Cu alloy layered metal structure was formed on a glass substrate (thickness: 0.7 mm).

Next, a gate insulating layer including the second oxygen-containing silicon layer a2, the silicon nitride layer n and the first oxygen-containing silicon layer a1 was formed so as to cover the gate metal layer. In Embodiment Example 1, a silicon oxynitride layer (thickness: 100 nm) as the second oxygen-containing silicon layer a2, the silicon nitride layer n (thickness: 300 nm), and a silicon oxide layer (thickness: 50 nm) as the first oxygen-containing silicon layer a1 were formed in this order on the gate metal layer. A plasma CVD method was used for the formation of these films. When forming the silicon oxynitride (SiOxNy) film, the flow rate ratio between the material gas ($SiH_4$) and the reaction gas ($NH_3$, $N_2$ and $N_2O$) was set so that x:y was about 1:1.

Then, a source metal layer including source and drain electrodes and pixel TFTs were formed, thus producing five each of sample substrates A1 to C1.

Method for Manufacturing Active Matrix Substrate of Embodiment Example 2

In Embodiment Example 2, a gate insulating layer that includes the silicon nitride layer n and the first oxygen-containing silicon layer a1 and that does not include the second oxygen-containing silicon layer a2 was formed. Specifically, the silicon nitride layer n (thickness: 400 nm) and a silicon oxide layer (thickness: 50 nm) as the first oxygen-containing silicon layer a1 were formed in this order on the gate metal layer. These films were formed by using a plasma CVD method as in Embodiment Example 1. Other than the gate insulating layer, five each of Sample Substrates A2 and C2 were produced by a method similar to Embodiment Example 1.

Method for Manufacturing Active Matrix Substrate of Reference Example

As an active matrix substrate of Reference Example, Sample Substrate D was produced by a method similar to Embodiment Example 2 except that a gate metal layer having a Cu/Ti layered metal structure was used.

Table 1 shows the thicknesses and compositions of the gate metal layers and the gate insulating layers of the sample substrates.

TABLE 1

| Sample | Lower layer of gate metal layer | | Upper layer of gate metal layer | | Gate insulating layer |
|---|---|---|---|---|---|
| | Composition | Thickness | Composition | Thickness | |
| A1 | Cu—Mg—Al (Al: 3 at %) | 30 nm | Cu | 400 nm | SiOx (50 nm)/ |
| B1 | | | | 450 nm | SiNz (300nm)/ |
| C1 | | | | 500 nm | SiOxNy (100 nm) |
| A2 | Cu—Mg—Al (Al: 3 at %) | 30 nm | Cu | 400 nm | SiOx (50 nm)/ |
| C2 | | | | 500 nm | SiNz (400 nm) |
| D | Ti | 30 nm | Cu | 480 nm | SiOx (50 nm)/ SiNz (400 nm) |

Next, the sheet resistances (mean values) of the gate metal layers of the sample substrates were measured. The results are shown in FIG. 3.

Figure 3:
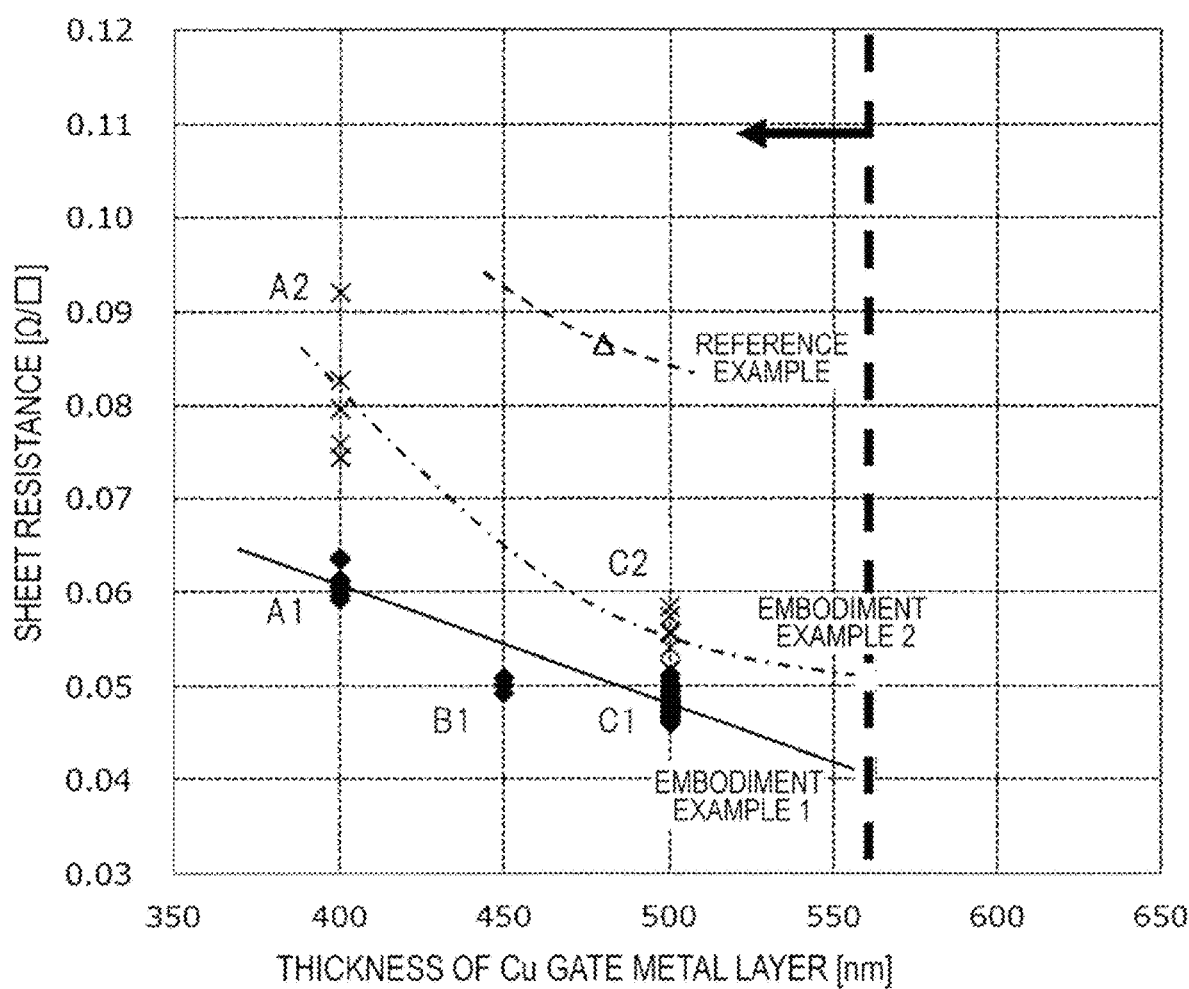
FIG. 3 is a graph showing the relationship between the thickness of the gate metal layer and the sheet resistance.

It is indicated from the results shown in FIG. 3 that it is possible to reduce the sheet resistance by changing the material of the lower layer of the gate metal layer from Ti to a Cu—Al alloy. The reason for this is discussed below.

When the lower layer of the gate metal layer is a Ti layer (Sample Substrates D), Ti diffuses into the Cu layer of the upper layer due to a thermal influence from the TFT process. As a result, the resistance of the Cu layer increases, thereby increasing the sheet resistance of the gate metal layer. In contrast, with a gate metal layer having a Cu/Cu alloy layered metal structure (Sample Substrates A1 to C1, A2 and C2), the increase in the resistance of the Cu layer due to the TFT process is suppressed. It is believed that this is because the amount of Al included in the Cu alloy layer is small (herein, 3 at %), and therefore even if a part of Al diffuses into the Cu layer, the electric resistance of the Cu layer does not increase as much as Sample Substrate D.

For example, when the thickness of the gate metal layer is 550 nm, the sheet resistance of the gate metal layer having a Cu/Cu alloy layered metal structure is 0.04 Ω/square, indicating that it is reduced to be about ½ that of the gate metal layer having a Cu/Ti layered metal structure.

Figure 6:
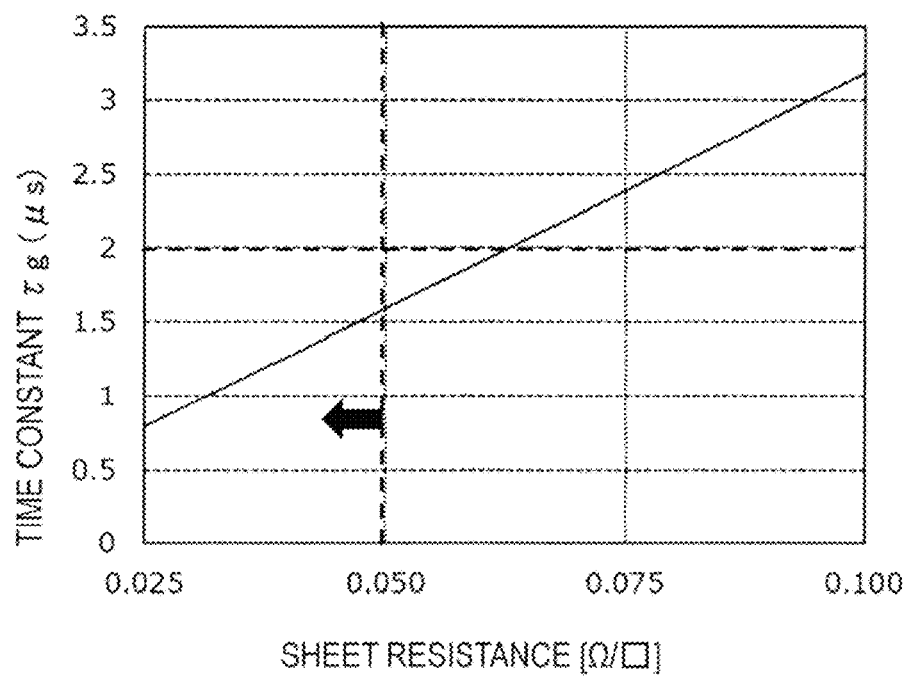
FIG. 6 is a graph showing the relationship between the sheet resistance of the gate and the time constant.

As can be seen from FIG. 3, the sheet resistance of the gate metal layer can generally be lowered by increasing the thickness of the gate metal layer (particularly, the Cu layer). However, if the gate metal layer is too thick, the substrate may be warped in some cases. When the substrate is warped, an edge of the glass substrate is off the stage of the transport device during the manufacturing process, thereby possibly causing a transport failure and lowering the mass productivity. As an example, where a glass substrate whose thickness is 0.7 mm is used, it is possible to suppress lowering of the mass productivity due to warping by suppressing the thickness of the gate metal layer to be 560 nm or less (preferably, 550 nm or less), for example. On the other hand, with a liquid crystal display panel having an 8K resolution, for example, the write time Tg is as short as about 2 μs, and it is required to suppress the time constant of the gate to be 2 μs or less, for example. Therefore, it is preferred that the sheet resistance of the gate metal layer is reduced to be, for example, 0.05 Ω/square or less (see FIG. 6). According to the present embodiment, it is possible to suppress the thickness of the gate metal layer (e.g., 550 nm or less), thereby reducing the sheet resistance of the gate metal layer to 0.05 Ω/square or less while suppressing the warping of the substrate, as shown in FIG. 3.

Moreover, it can be seen from the results shown in FIG. 3 that with Sample Substrates A1 to C1, in which a silicon oxynitride (SiOxNy) layer is provided as the lowermost layer of the gate insulating layer, the sheet resistance of the gate metal layer is further reduced and variations in the sheet resistance are also suppressed as compared with Sample Substrates A2 and C2, in which the lowermost layer of the gate insulating layer is a silicon nitride (SiNz) layer. It is believed that this is because diffusion of an impurity from the gate insulating layer into the gate metal layer is suppressed, thereby suppressing the increase in the resistance of the Cu layer due to diffusion of an impurity. It is also indicated from FIG. 3 that such an advantageous effect is more pronounced as the Cu layer is thinner.

<Evaluation of Adhesion of Cu Alloy Layer of Gate Metal Layer>

Relationship Between Thickness and Adhesion of Cu Alloy Layer

The relationship between the thickness and the adhesion of the Cu alloy film was examined using a cross-cut method as defined in JIS K 5600.

Specifically, first, a Cu alloy film and a Cu film were deposited in this order on a glass substrate surface, thereby forming a layered metal film. A Cu—Mg—Al alloy film (Mg: 2 at %, Al: 3 at %) was used as the Cu alloy film. A plurality of evaluation samples were produced by varying the thickness of the Cu alloy film while keeping the thickness of the Cu film constant (500 nm).

Then, for each evaluation sample, a lattice pattern is cut into the layered metal film, thereby cutting the layered metal film into 10×10, or 100, squares. Then, a tape test was performed. After peeling off the tape, the separation of the layered metal film was classified into six levels (separation levels) at nine points on the surface. Table 2 shows classification of separation levels Lv0 to Lv6 (in accordance with the six-level classification of the cross-cut method), and Table 3 shows the adhesion evaluation results.

TABLE 2

| Separation levels | Separation of Cu alloy film |
|---|---|
| Lv0 | No separation |
| Lv1 | Separation: 5% or less |
| Lv2 | Separation: more than 5% and 15% or less |
| Lv3 | Separation: more than 15% and 35% or less |
| Lv4 | Separation: more than 35% and 65% or less |
| Lv5 | Separation: more than 65% |

TABLE 3

| Thickness of Cu film (nm) | Thickness of Cu alloy film (nm) | Separation level at 9 surface points | | | | | | Judgment |
|---|---|---|---|---|---|---|---|---|
| | | Lv0 | Lv1 | Lv2 | Lv3 | Lv4 | Lv5 | |
| 500 | 50 | 9 points | — | — | — | — | — | ○ |
| | 45 | 9 points | — | — | — | — | — | ○ |
| | 40 | 9 points | — | — | — | — | — | ○ |
| | 35 | 9 points | — | — | — | — | — | ○ |
| | 30 | 7 points | 2 points | — | — | — | — | Δ |
| | 25 | — | — | — | — | — | 9 points | x |
| | 20 | — | — | — | — | — | 9 points | x |
| | 0 | — | — | — | — | — | 9 points | x |

It was indicated from the results shown in Table 3 that it is possible to ensure a sufficient adhesion to the substrate surface when the thickness of the Cu alloy film is 30 nm or more, preferably 35 nm or more.

Note that the lower limit value of the thickness of the Cu alloy film with which adhesion can be ensured may vary depending on the material of the base surface. While a layered metal film was formed directly on a glass substrate surface, the Cu alloy film can be made even thinner if a base insulating film is formed between the glass substrate and the layered metal film.

Relationship Between Al Content of Cu Alloy Layer and Adhesion of Cu Alloy Layer The relationship between the Al content of the Cu alloy film and the adhesion was examined by using the cross-cut method described above.

Specifically, a Cu alloy film and a Cu film were formed on a glass substrate surface, thereby obtaining a layered metal film. A plurality of evaluation samples were produced while varying the composition of the Cu alloy film (Cu—Mg—Al alloy film). The thickness of the Cu film was set to 500 nm, and the thickness of the Cu alloy film was set to 45 nm. Note that for the purpose of comparison, an evaluation sample was also produced, in which a Cu film (thickness: 500 nm) was formed directly on the substrate surface, without forming a Cu alloy film.

Next, with a similar tape test to that described above, the adhesion (the separation level) of the layered metal film was evaluated at nine surface points of each evaluation substrate. Table 4 shows the evaluation results.

TABLE 4

| Composition (at %) | | | Separation level at 9 surface points | | | | | | Judgment |
|---|---|---|---|---|---|---|---|---|---|
| Cu | Mg | Al | Lv0 | Lv1 | Lv2 | Lv3 | Lv4 | Lv5 | |
| 100 | 0 | 0 | — | — | — | — | — | 9 points | x |
| 96 | 2 | 2 | 9 points | — | — | — | — | — | ○ |
| 95 | 2 | 3 | 9 points | — | — | — | — | — | ○ |
| 90 | 2 | 8 | 9 points | — | — | — | — | — | ○ |

It is indicated from the results shown in Table 4 that a Cu alloy film of an Al-containing Cu alloy has a higher adhesion to the substrate surface than a Cu film. It is also indicated that it is possible to ensure a high adhesion if the composition ratio of Al is 2 at % or more.

<Etching Amount of Glass Substrate and Cross-Sectional Shape of Gate Metal Layer>

Observation substrates of Embodiment Example and Reference Example were produced, and the cross-sectional shapes of the gate metal layer and the glass substrate were observed.

A Cu alloy film (thickness: 45 nm) and a Cu film (thickness: 500 nm) were formed directly on the glass substrate surface, thereby obtaining a layered metal film. Herein, a Cu—Mg—Al alloy film (Mg: 2 at %, Al: 3 at %) was formed as the Cu alloy film. Then, the layered metal film was patterned by using a hydrogen peroxide-based etchant (that does not include ammonium fluoride and acidic ammonium fluoride), thereby obtaining the gate metal layer. Then, the observation substrate of Embodiment Example was produced by using a predetermined TFT process.

For the purpose of comparison, an observation substrate of Reference Example was produced by using a similar material and a similar method to those of Embodiment Example, except that a Ti film (thickness: 25 nm) and a Cu film (thickness: 500 nm) were formed as the layered metal film and an ammonium fluoride-containing etchant was used to pattern the layered metal film.

Then, cross sections of the observation substrates of Embodiment Example and Reference Example were observed to examine the cross-sectional shape of the gate metal layer and the etching amount of the glass substrate.

Figure 4A:
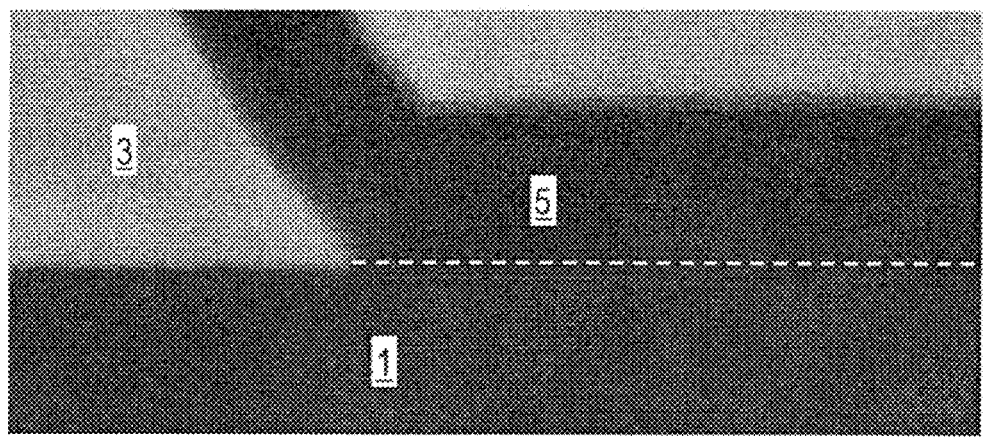
FIG. 4A shows a cross-sectional SEM image of an active matrix substrate of Embodiment Example.

FIG. 4A shows a cross-sectional SEM image of the observation substrate of Embodiment Example, showing an enlarged view of the vicinity of the interface between the substrate (glass substrate) 1 and the gate electrode 3 and the gate insulating layer 5. It is indicated from this figure that in Embodiment Example, the surface of the glass substrate was not substantially etched in the step of patterning the layered metal film.

Figure 4B:
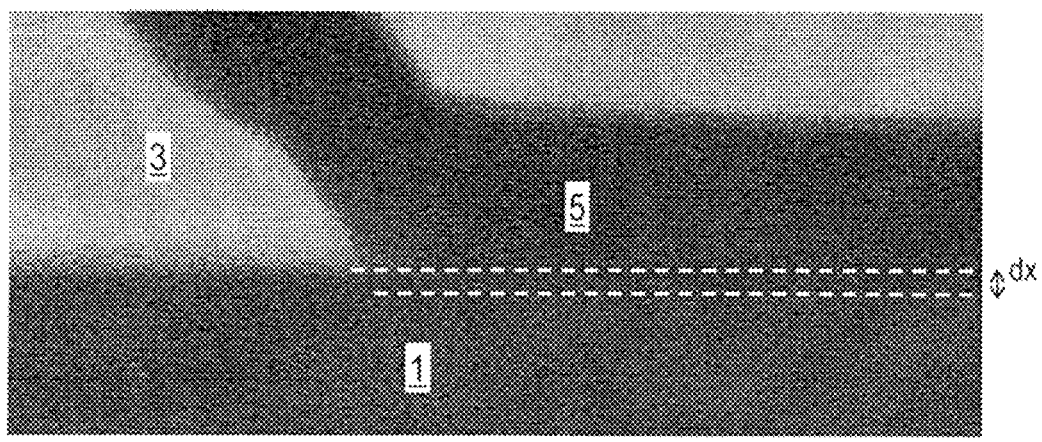
FIG. 4B shows a cross-sectional SEM image of an active matrix substrate of Reference Example.

FIG. 4B shows a cross-sectional SEM image of the observation substrate of Reference Example, showing an enlarged view of the vicinity of the interface between the substrate (glass substrate) 1 and the gate electrode 3 and the gate insulating layer 5. It is indicated from this figure that in Reference Example, a surface portion of the glass substrate has been etched along the pattern of the gate metal layer in the step of patterning the layered metal film. The etching amount of the glass substrate (the thickness of the etched portion) dx was measured to be 35 nm. If the glass substrate is etched, the strength of the glass substrate may be lowered, thereby lowering the reliability of the active matrix substrate, as described above.

<Light Transmittance>

A liquid crystal panel of Embodiment Example that has a gate metal layer of a Cu/Cu alloy layered metal structure, and a liquid crystal panel of Reference Example that has a gate metal layer of a Cu/Ti layered metal structure were produced and compared against each other in terms of the transmittance for visible light. In Embodiment Example, the thickness of the Cu alloy layer was set to 45 nm and the thickness of the Cu layer to 500 nm. A Cu—Mg—Al alloy layer (Mg: 2 at %, Al: 3 at %) was used as the Cu alloy layer. In Reference Example, the thickness of the Ti layer was set to 350 nm, and the thickness of the Cu layer to 500 nm.

Then, the transmittances for visible light of the liquid crystal panels of Embodiment Example and Reference Example were measured. The transmittance was measured at eight points on the substrate.

Figure 5:
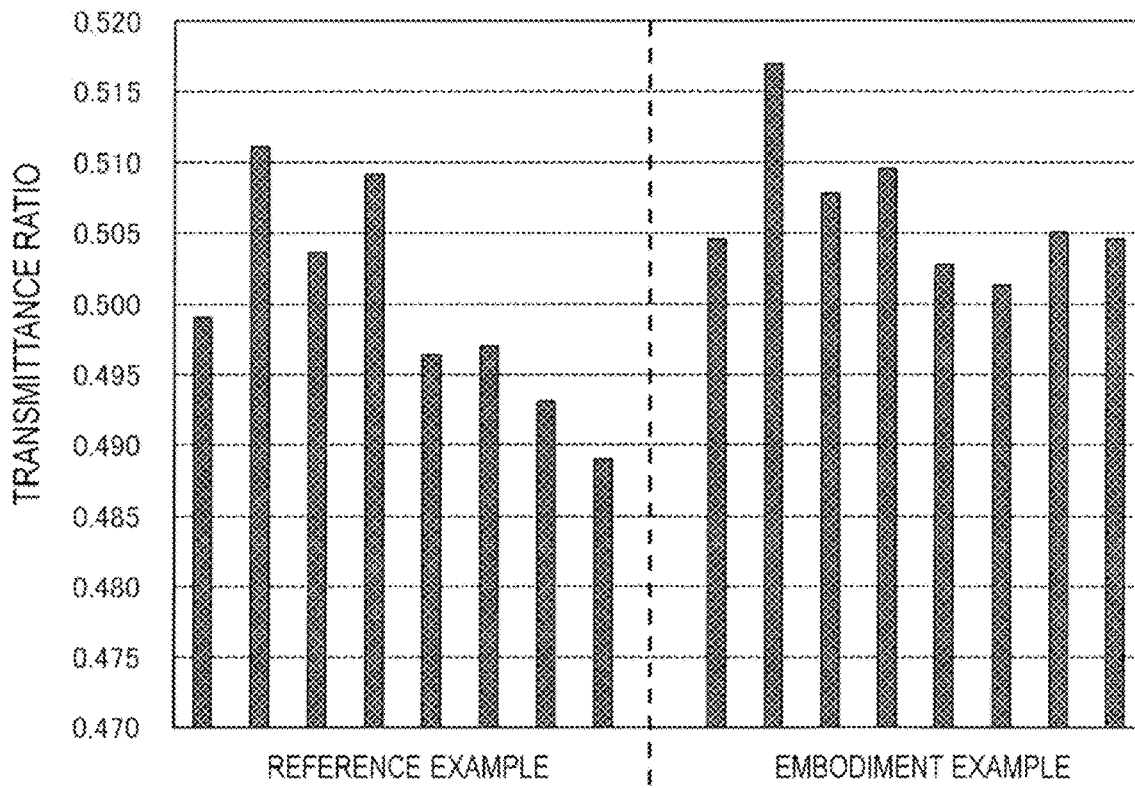
FIG. 5 is a graph showing transmittances for visible light of display panels of Embodiment Example and Reference Example.

The results are shown in FIG. 5. The "transmittance ratio" shown along the vertical axis of FIG. 5 is the transmittance ratio as determined with the average transmittance of the active matrix substrate of Reference Example being 0.500.

It is indicated from the measurement results that the average transmittance ratio of the liquid crystal panel of Embodiment Example is 0.507, higher than that of Reference Example by about 1.4%. It is believed that this is because when a Cu alloy layer is provided as the lower layer of the gate metal layer, light from the backlight that is incident upon the lower surface of the gate metal layer (the lower surface of the Cu alloy layer) is reflected so that the light can be used (reused) for display. In contrast, in Reference Example, since a Ti layer having a lower reflectivity than a Cu alloy layer is used as the lower layer of the gate metal layer, the proportion of light from the backlight incident upon the lower surface of the gate metal layer (the lower surface of the Ti layer) that can be reused is smaller than in Embodiment Example. It is believed that this is why the transmittance is lower than in Embodiment Example.

(Regarding TFT Structure and Oxide Semiconductor)

The TFT structure is not limited to the structure illustrated in FIGS. 2A to 2C. For example, while the TFT 101 shown in FIGS. 2A to 2C has a top contact structure in which the source and drain electrodes are in contact with the upper surface of the semiconductor layer, the source and drain electrodes may have a bottom contact structure in which they are in contact with the lower surface of the semiconductor layer.

While the TFT 101 shown in FIGS. 2A to 2C has a channel-etched structure, it may have an etch-stop structure. In a "channel-etched TFT", no etch stop layer is formed over the channel region, and the lower surface of the channel-side end portions of the source and drain electrodes are arranged so as to be in contact with the upper surface of the oxide semiconductor layer. The passivation film covering the TFT is in direct contact with the channel region of the semiconductor layer. On the other hand, in an "etch-stop-type TFT", an etch stop layer is formed over the channel region. The lower surfaces of the channel-side end portions of the source and drain electrodes are located on the etch stop layer, for example. An etch-stop-type TFT can be formed by, for example, forming an etch stop layer that covers a portion of the oxide semiconductor layer to be the channel region, then forming a source-drain electrode conductive film on the oxide semiconductor layer and the etch stop layer, and then performing source/drain separation.

<Oxide Semiconductor>

The oxide semiconductor included in the oxide semiconductor layer 7 may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The oxide semiconductor layer 7 may have a layered structure of two layers or more. When the oxide semiconductor layer 7 has a layered structure, the oxide semiconductor layer 7 may include an amorphous oxide semiconductor layer and a crystalline oxide semiconductor layer. Alternatively, it may include a plurality of crystalline oxide semiconductor layers of different crystalline structures. It may include a plurality of amorphous oxide semiconductor layers. When the oxide semiconductor layer 7 has a two-layer structure including an upper layer and a lower layer, the energy gap of the oxide semiconductor included in the upper layer preferably has a greater energy gap than that of the oxide semiconductor included in the lower layer. Note however that when the difference in energy gap between these layers is relatively small, the energy gap of the oxide semiconductor of the lower layer may be greater than the energy gap of the oxide semiconductor of the upper layer.

The material, the structure, the film formation method of the amorphous oxide semiconductor and each of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The oxide semiconductor layer 7 may include at least one metal element from among In, Ga and Zn, for example. In the present embodiment, the oxide semiconductor layer 7 includes an In—Ga—Zn—O-based semiconductor (e.g., indium gallium zinc oxide), for example. Herein, an In—Ga—Zn—O-based semiconductor is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1 and In:Ga:Zn=1:1:2, for example. Such an oxide semiconductor layer 7 can be formed from an oxide semiconductor film including an In—Ga—Zn—O-based semiconductor.

An In—Ga—Zn—O-based semiconductor may be amorphous or crystalline. A crystalline In—Ga—Zn—O-based semiconductor is preferably a crystalline In—Ga—Zn—O-based semiconductor whose c-axis is oriented generally perpendicular to the layer surface.

Note that crystalline structures of crystalline In—Ga—Zn—O-based semiconductors are disclosed in, for example, Japanese Laid-Open Patent Publication No. 2014-007399, supra, Japanese Laid-Open Patent Publication No. 2012-134475, Japanese Laid-Open Patent Publication No. 2014-209727, etc. The disclosures of Japanese Laid-Open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than 1/100 that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The oxide semiconductor layer 7 may include another oxide semiconductor, instead of an In—Ga—Zn—O-based semiconductor. For example, it may include an In—Sn—

Zn—O-based semiconductor (e.g., IbO$_3$—SnO$_2$—ZnO; InSnZnO). An In—Sn—Zn—O-based semiconductor is a ternary oxide of In (indium), Sn (tin) and Zn (zinc). Alternatively, the oxide semiconductor layer 7 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, an In—Ga—Zn—Sn—O-based semiconductor, etc.

The embodiment described above is suitably applicable to an active matrix substrate using oxide semiconductor TFTs. Active matrix substrates can be used in various display devices such as liquid crystal display devices, organic EL display devices and inorganic EL display devices, and electronic devices including display devices, etc. On an active matrix substrate, oxide semiconductor TFTs can be used not only as switching elements provided in pixels but also as circuit elements of peripheral circuits such as drivers (monolithicization). In such a case, oxide semiconductor TFTs of the present invention, which use an oxide semiconductor layer having a high mobility (e.g., 10 cm$^2$/Vs or more) as the active layer, can suitably be used as circuit elements.

The embodiments of the present invention are widely applicable to various semiconductor devices including oxide semiconductor TFTs. For example, they are applicable to circuit boards such as active matrix substrates, display devices such as liquid crystal display devices, organic electroluminescence (EL) display devices, inorganic electroluminescent display devices and MEMS display devices, image pickup devices such as image sensor devices, and various electronic devices such as image input devices, fingerprint reader devices and semiconductor memory devices.

This application is based on Japanese Patent Applications No. 2018-052824 filed on Mar. 20, 2018 and No. 2018-174678 filed on Sep. 19, 2018, the entire contents of which are hereby incorporated by reference.

What is claimed is:

1. An active matrix substrate having a plurality of pixel regions, the active matrix substrate comprising:
    a substrate;
    a source metal layer including a plurality of source bus lines and a gate metal layer including a plurality of gate bus lines, supported on the substrate; and
    a thin film transistor and a pixel electrode arranged in each of the plurality of pixel regions, wherein:
    the thin film transistor includes a gate electrode, a gate insulating layer covering the gate electrode, an oxide semiconductor layer arranged on the gate insulating layer, and a source electrode and a drain electrode electrically connected to the oxide semiconductor layer, Wherein the gate electrode is formed in the gate metal layer and is electrically connected to a corresponding one of the plurality of gate bus lines, the source electrode is electrically connected to a corresponding one of the plurality of source bus lines, and the drain electrode is electrically connected to the pixel electrode;
    the gate metal layer has a layered structure including a copper alloy layer and a copper layer, wherein the copper alloy layer is a lowermost layer of the gate metal layer, and the copper layer is arranged on the copper alloy layer; and
    the copper alloy layer is of a copper alloy including Cu and at least one additive metal element, wherein the at least one additive metal element includes Al, and an Al content of the copper alloy is 2 at % or more and 8 at % or less.

2. The active matrix substrate according to claim 1, wherein the at least one additive metal element further includes Mg.

3. The active matrix substrate according to claim 1, wherein a Mg content of the copper alloy is 1 at % or more and 3 at % or less.

4. The active matrix substrate according to claim 1, wherein a Cu content of the copper alloy is 80 at % or more.

5. The active matrix substrate according to claim 1, wherein the at least one additive metal element does not include P.

6. The active matrix substrate according to claim 1, wherein the gate insulating layer includes an oxygen-containing silicon layer in direct contact with an upper surface of the copper layer, and the oxygen-containing silicon layer is a silicon oxide layer or a silicon oxynitride layer.

7. The active matrix substrate according to claim 6, wherein the oxygen-containing silicon layer is a silicon oxynitride layer expressed as SiOxNy (2>x>0, 4/3>y>0), wherein x and y satisfy 0.4≤x/(x+y)<1.

8. The active matrix substrate according to claim 7, wherein x and y satisfy x≥y.

9. The active matrix substrate according to claim 6, wherein:
    the gate insulating layer has a layered structure including the oxygen-containing silicon layer, another oxygen-containing silicon layer in direct contact with the oxide semiconductor layer, and a silicon nitride layer located between the oxygen-containing silicon layer and the another oxygen-containing silicon layer; and
    the another oxygen-containing silicon layer is a silicon oxide layer or a silicon oxynitride layer.

10. The active matrix substrate according to claim 9, wherein:
    the another oxygen-containing silicon layer is a silicon oxide layer; and
    the gate insulating layer further includes an intermediate layer of silicon oxynitride between the another oxygen-containing silicon layer and the silicon nitride layer.

11. The active matrix substrate according to claim 1, wherein a thickness of the copper alloy layer is less than a thickness of the copper layer.

12. The active matrix substrate according to claim 1, wherein a thickness of the copper alloy layer is 30 nm or more.

13. The active matrix substrate according to claim 1, wherein an overall thickness of the gate metal layer is 550 nm or less, and a sheet resistance of the gate metal layer is 0.05 Ω/square or less.

14. The active matrix substrate according to claim 1, wherein the substrate is a glass substrate, and the copper alloy layer is in direct contact with a surface of the glass substrate.

15. The active matrix substrate according to claim 1, wherein the oxide semiconductor layer includes In, Ga and Zn.

16. An active matrix substrate having a plurality of pixel regions, the active matrix substrate comprising:
- a substrate;
- a source metal layer including a plurality of source bus lines and a gate metal layer including a plurality of gate bus lines, supported on the substrate; and
- a thin film transistor and a pixel electrode arranged in each of the plurality of pixel regions, wherein:
- the thin film transistor includes a gate electrode, a gate insulating layer covering the gate electrode, an oxide semiconductor layer arranged on the gate insulating layer, and a source electrode and a drain electrode electrically connected to the oxide semiconductor layer, wherein the gate electrode is formed in the gate metal layer and is electrically connected to a corresponding one of the plurality of gate bus lines, the source electrode is electrically connected to a corresponding one of the plurality of source bus lines, and the drain electrode is electrically connected to the pixel electrode;
- the gate metal layer includes a copper layer in direct contact with the gate insulating layer;
- the gate insulating layer has a layered structure including a first oxygen-containing silicon layer in direct contact with the oxide semiconductor layer, a second oxygen-containing silicon layer in direct contact with an upper surface of the copper layer, and a silicon nitride layer located between the first oxygen-containing silicon layer and the second oxygen-containing silicon layer; and
- the first oxygen-containing silicon layer and the second oxygen-containing silicon layer are each a silicon oxide layer or a silicon oxynitride layer.

17. The active matrix substrate according to claim 16, wherein the second oxygen-containing silicon layer is a silicon oxynitride layer expressed as SiOxNy (2>x>0, 4/3>y>0), wherein x and y satisfy 0.4≤x/(x+y)<1.

18. The active matrix substrate according to claim 17, wherein x and y satisfy x≥y.

19. The active matrix substrate according to claim 16, wherein the first oxygen-containing silicon layer is a silicon oxide layer.

20. The active matrix substrate according to claim 19, further including an intermediate layer of silicon oxynitride between the first oxygen-containing silicon layer and the silicon nitride layer.

* * * * *